United States Patent [19]
Tsen

[11] Patent Number: 5,936,906
[45] Date of Patent: Aug. 10, 1999

[54] MULTILEVEL SENSE DEVICE FOR A FLASH MEMORY

[75] Inventor: Huan-Chiu Tsen, Hsinchu, Taiwan

[73] Assignee: Winbond Electronics Corp., Taiwan

[21] Appl. No.: 09/183,332

[22] Filed: Oct. 29, 1998

[51] Int. Cl.⁶ .................................................. G11C 16/04
[52] U.S. Cl. ................ 365/210; 365/185.03; 365/185.21
[58] Field of Search ............................... 365/210, 185.03, 365/185.2, 185.21, 185.33

[56] References Cited

U.S. PATENT DOCUMENTS

| | | | |
|---|---|---|---|
| 5,768,188 | 6/1998 | Park et al. | 365/185.03 |
| 5,768,191 | 6/1998 | Choi et al. | 365/185.22 |
| 5,862,074 | 1/1999 | Park | 365/185.03 |

Primary Examiner—Vu A. Le
Attorney, Agent, or Firm—Blakely Sokoloff Taylor & Zafman

[57] ABSTRACT

A multilevel sense device for a flash memory according to the invention is disclosed. When reading multilevel digital data stored in a selected cell of a primary cells array, the primary cells array generates and transmits a sense current to a sense amplifier. Then, the sense current is compared with permanent currents pre-established by a reference cells array thereby to determine/fetch the digital data. Furthermore, in the multilevel sense device, multilevel digital data stored in a selected cell are totally read out in one time. This causes more reading time saved.

12 Claims, 8 Drawing Sheets

MULTILEVEL SENSE DEVICE FOR A FLASH MEMORY

CROSS-REFERENCE TO RELATED APPLICATION

This application claims the priority benefit of Taiwan application Ser. No. 87113402, filed Aug. 14, 1998, the full disclosure of which is incorporated herein by reference.

BACKGROUND OF THE INVENTION

1. Field of the Invention

The invention relates to a non-volatile semiconductor memory device, and in particular to a multilevel sense device for a flash memory.

2. Description of the Related Art

In a traditional semiconductor memory device, when a datum is written to a cell of an erasable programmable ROM (EPROM), charges are transmitted to a floating gate via a tunnel insulating film. At this time, if the cell is at a first state, such as a low logic level "0", the threshold voltage ($V_{TH}$) thereof is set at a high logic level voltage. In contrast, if the charges on the floating gate are removed, the cell is charged into a second state, such as a high logic level "1", and the threshold voltage thereof is set at a low logic level voltage. When a digital datum stored in the cell is read, whether the digital datum is a logic level "1" or "0" can be determined/fetched by sensing the threshold voltage of the cell. A datum with one of the first state and the second state, can be stored in the traditional EPROPM by applying a threshold voltage lower than the high logic level or higher than the low logic level to the control gate. However, each time only an one-bit datum can be stored in a cell during programming. Therefore, the traditional EPROM has a disadvantage of small memory capacity.

Referring to FIG. 1, a traditional sense device for a flash memory, which can read 2-bit digital data, is shown. Typically, digital data stored in the flash memory are read out bit by bit. For example, when reading 2-bit digital data "10" which are stored in a flash cell 10, the first bit (high bit) "1" is transmitted to a comparator 12 to compare it with a reference value of a first reference array 14 so as to output the high bit "1". The second bit (low bit) "0" is transmitted to the comparator 16 to compare it with a reference value of a second reference array 18 so as to output the low bit "0". It is obvious that n-bit digital data require n reference arrays for comparisons. Therefore, it takes a great amount of time for data reading. In addition, the traditional method for data reading makes the entire layout areas of devices larger under the development of high memory capacity.

As described above, the traditional flash memory has no enough memory capacity owing to only a small number of bits stored in each cell thereof for access. Furthermore, it takes a great amount of time to read digital data bit by bit. Many reference arrays are needed for completing the purpose of reading, resulting in a difficulty for miniaturization.

SUMMARY OF THE INVENTION

In view of the above, a first object of the invention is to provide a multilevel sense device for a flash memory where digital data stored in a selected cell are completely read out in one time thereby to shorten reading time, unlike the prior art where digital data stored in a selected cell are read bit by bit.

A second object of the invention is to provide a multilevel sense method for a flash memory, by which digital data stored in a selected cell can be rapidly read out in one time.

Furthermore, a third object of the invention is to provide a multilevel sense device for a flash memory where each flash cell can store multilevel digital data thereby to increase memory capacity.

The above-mentioned flash memory comprises a primary cells array having a plurality of word lines and bit lines, a word-line decoder coupled to the word lines of the primary cells array and a bit-line decoder coupled to the bit lines of the primary cells array. In the multilevel sense device according to the invention, a reference cells array, which is used to completely read multilevel digital data stored in a selected cell in one time, is coupled to a primary cells array for sharing the word lines thereof. Moreover, the reference cells array outputs a plurality of permanent reference currents thereby to create a plurality of current comparison intervals. When reading digital data stored in a selected cell of the primary cells array, the primary cells array generates a sense current which is used to compare with the comparison current intervals thereby to determine/fetch the digital data which is corresponding to the sense current.

Unlike the prior art where digital data stored in a selected cell are read bit by bit, in the invention, digital data stored in a selected cell are completely read out in one time thereby to shorten the reading time.

BRIEF DESCRIPTION OF THE DRAWINGS

The present invention will be more fully understood from the detailed description given hereinbelow and the accompanying drawings which are given by way of illustration only, and thus do not limit the present invention, and wherein.

DETAILED DESCRIPTION OF THE EMBODIMENTS

Figure 1:
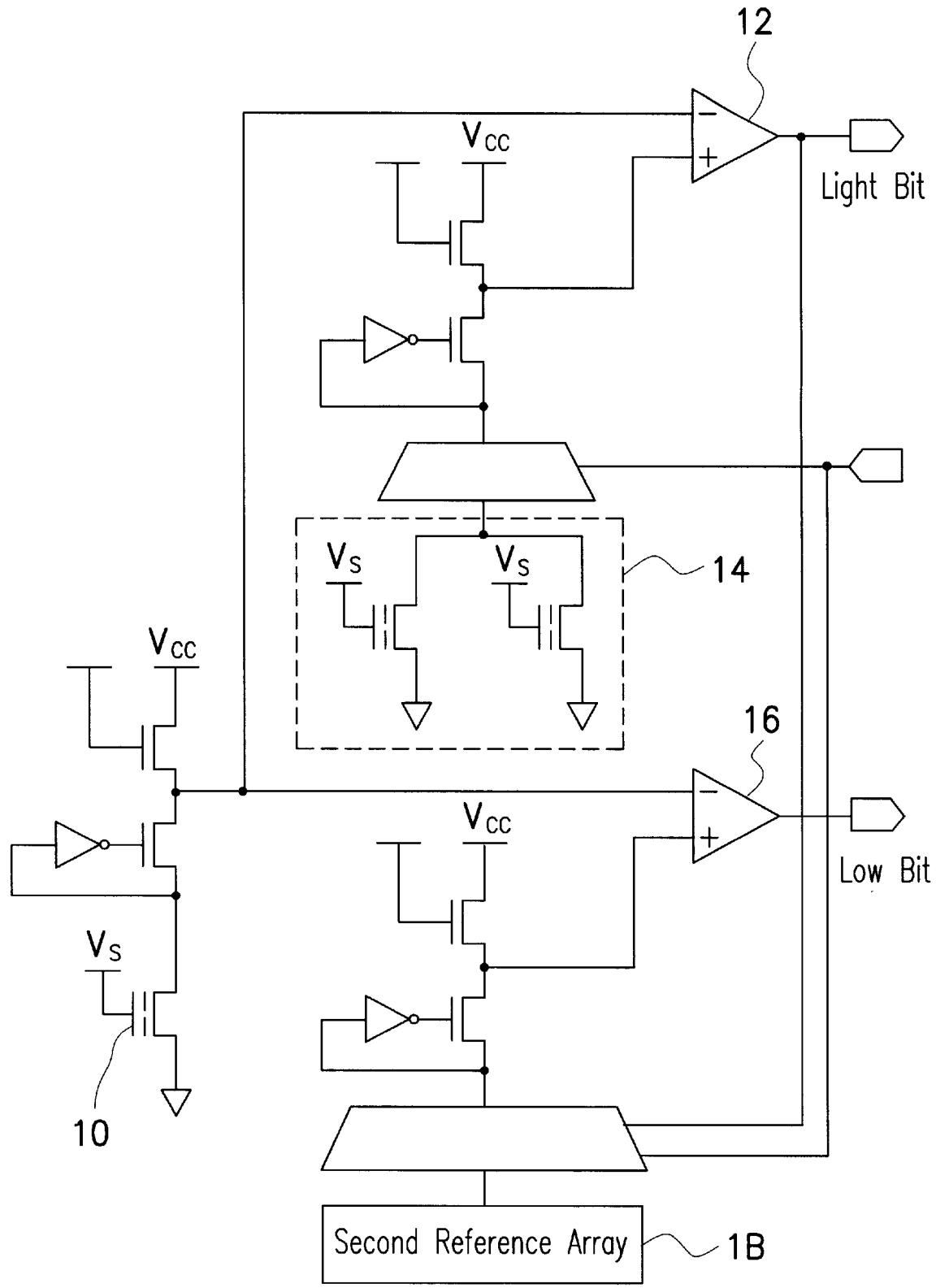
FIG. 1 is a circuit diagram showing a sense device for a flash memory according to the prior art.
Figure 2:
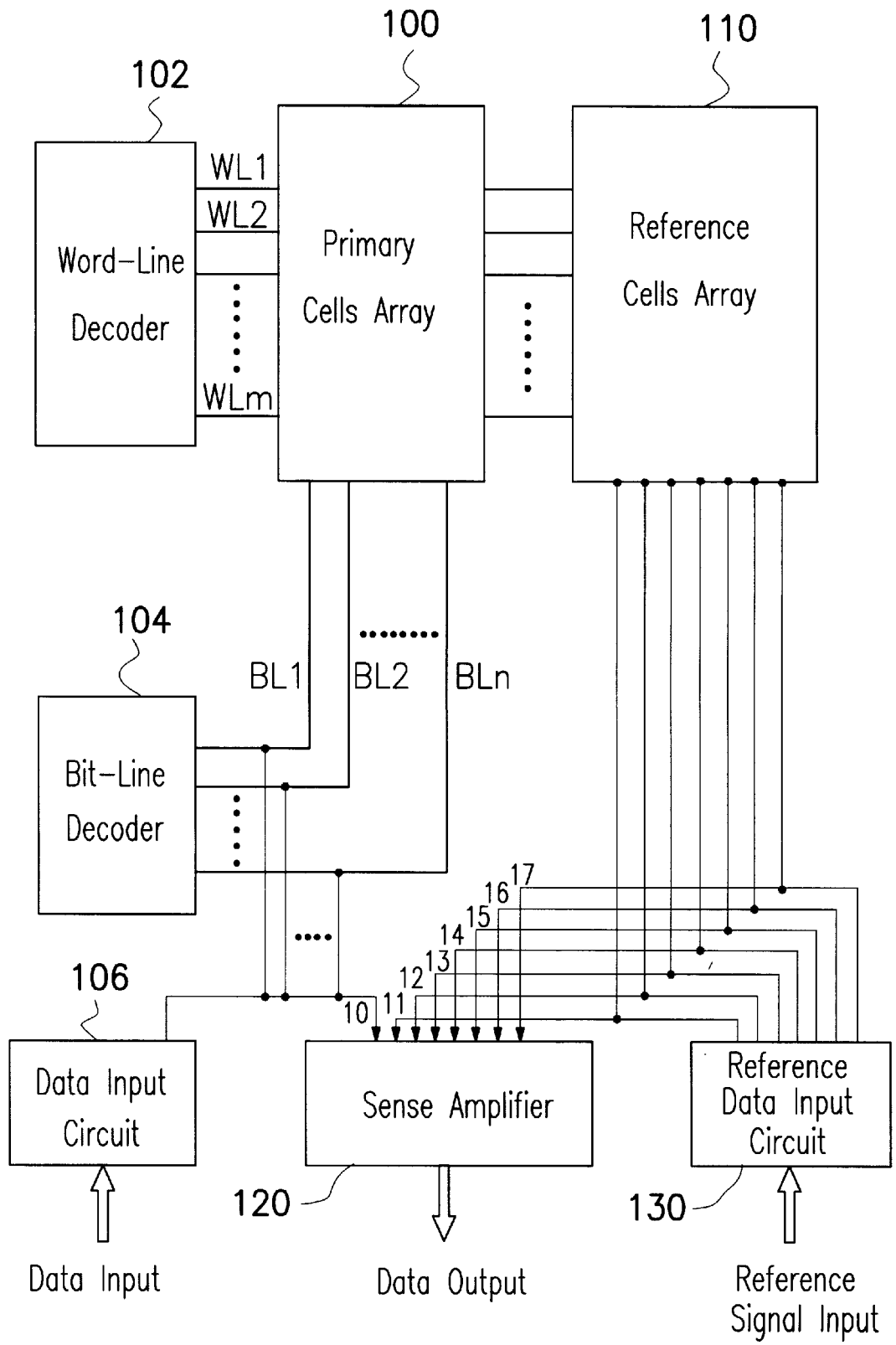
FIG. 2 is a circuit block diagram showing a multilevel sense device for a flash memory according to the invention.

FIG. 2 is a circuit diagram showing a multilevel sense device for a flash memory according to the invention. In FIG. 2, a primary cells array 100 includes a plurality of flash cells and a plurality of word lines WL1~WLm and bit lines BL1~BLn. Each flash cell can store multilevel digital data, such as 2-bit, 3-bit or 4-bit digital data. Furthermore, a word line decoder 102, which is electrically coupled to the primary cells array 100 via the word lines WL1~WLm, is used to select one of the word lines WL1~WLm. A bit-line decoder 104, which is electrically coupled to the primary cells array 100 via the bit lines BL1~BLn, is used to select one of the bit lines BL1~BLn. Therefore, one of the flash cells can be selected by the word line decoder 102 and the bit line decoder 104 for data programming/erasing or read/write.

In addition, a reference cells array 110 is electrically coupled to the primary cells array 100 via the word lines WL1~WLm for sharing the word lines WL1~WLm. The reference cells array 100 is also coupled to a sense amplifier 120 and a reference data input circuit 130 which transmits a reference value for comparison to the reference cells array 110. When the reference value for comparison is input to each cell of the reference cells array 110, the reference cells array 110 outputs, for example, a plurality of reference currents I1~I7 to the sense amplifier 120 for comparison. A plurality of current comparison intervals, less than I1, I1~I2, I2~I3, ..., I5~I6, I6~I7 and more than I7, are formed by the ranges between two adjacent reference currents.

A data input circuit 106 is electrically coupled to the bit lines BL1~BLn of the primary cells array 100 so as to input digital data to a selected cell of the primary cells array 100.

When the word line decoder 102 and the bit line decoder 104 select a flash cell of the primary cells array 100 for reading multilevel digital data storing in the selected flash cell, a sense current I0, representing the multilevel digital data stored in the flash cell, is generated and input to the sense amplifier 120. Then, the sense current I0 is compared with the reference currents I1~I7 thereby to determine which comparison current interval the sense current I0 belongs to, such that the digital data stored in the flash cell is correctly read out. For example, if the I0 is located between the I4 and I5, the digital data corresponding to the I0 is "011." As can be seen from the above, unlike a sense device in the prior art which reads multilevel digital data bit by bit, the multilevel sense device of the invention can completely read out multilevel digital data in one time. Therefore, the multilevel sense device according to the invention can save more time for reading.

Figure 3:
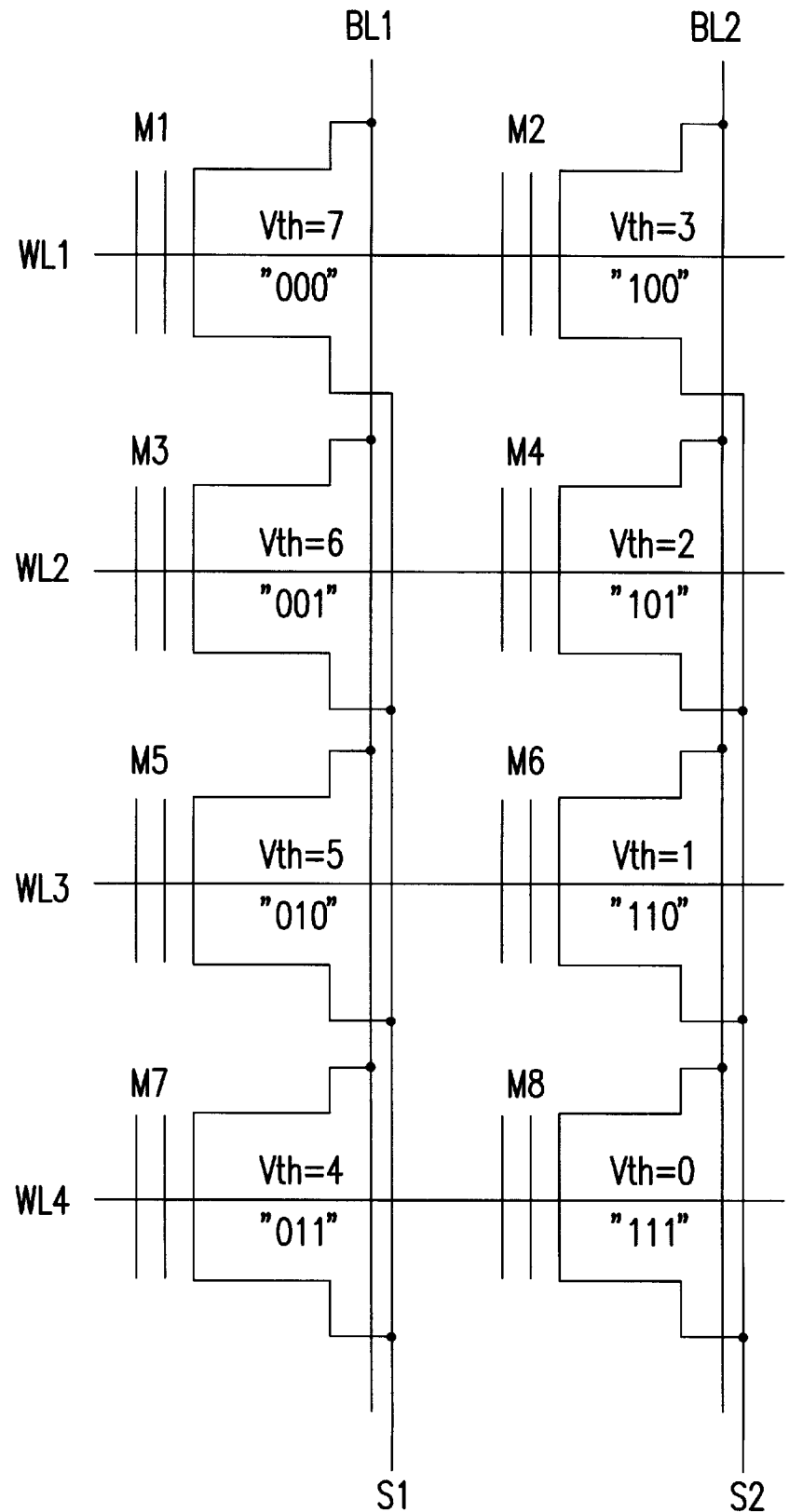
FIG. 3 is a schematic view showing a primary cells array each cell of which can store 3-bit digital data.

As an example, a primary cells array shown in FIG. 3 includes 8 flash cells M1~M8 each of which can store 3-bit digital data.

As shown in FIG. 3, 8 sets of digital data "111", "110", ..., "000" are stored in the flash cells M1~M8 in order. The threshold voltages of the flash cells M1~M8 are 7V, 3V, 6V, 2V, 5V, 1V, 4V and 0V, respectively. For example, when the digital data "000" needs to be written into the flash cell M1, a voltage in the range of 12V–15V is applied to a word line WL1 while the other word lines WL2~WL4 are floating without any voltages applied or are grounded, so that threshold voltage of the flash cell M1 is set at 7V. Similarly, the other sets of digital data can be optionally stored in the corresponding flash cells.

Figure 4:
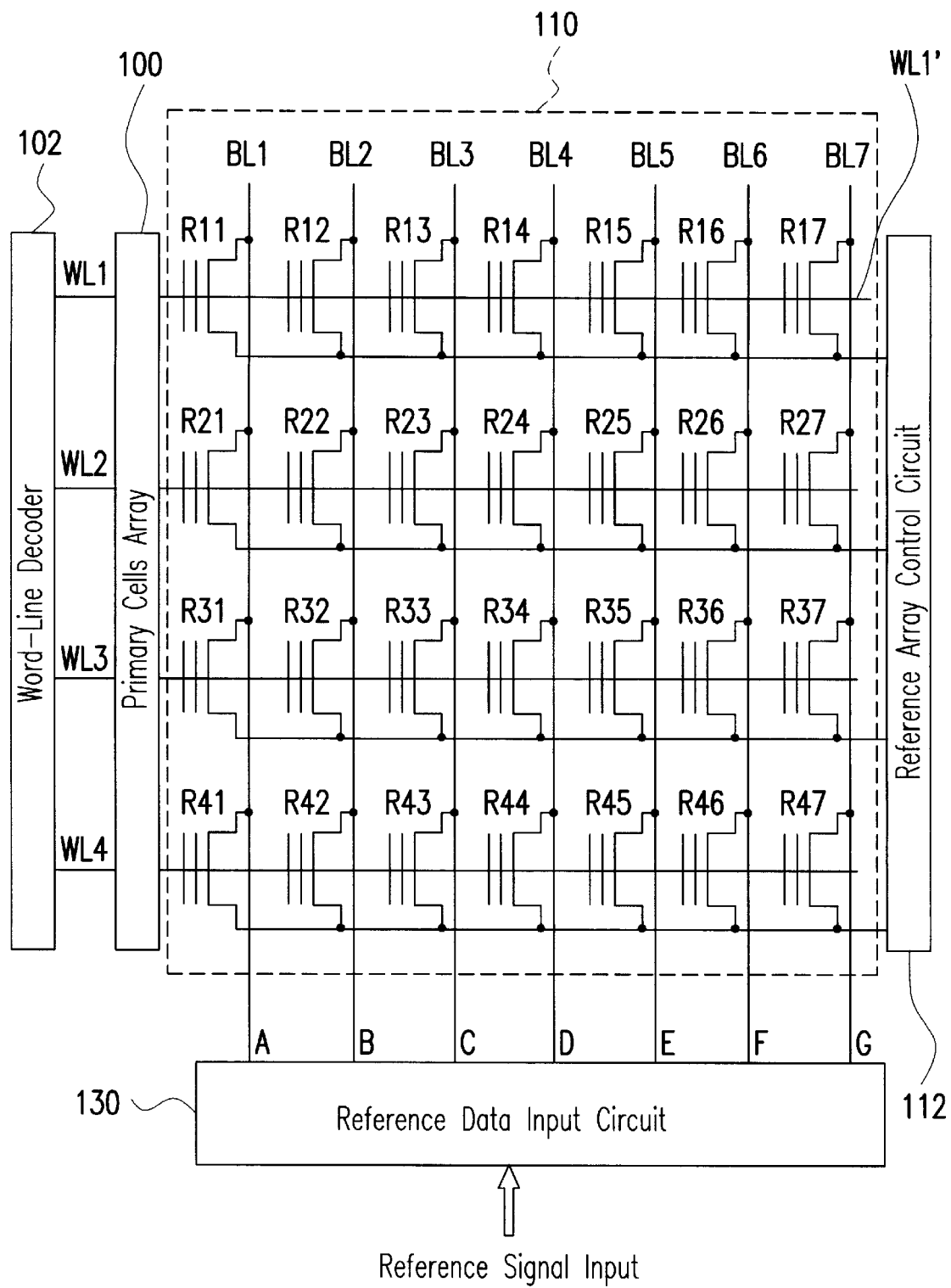
FIG. 4 is a schematic view showing a reference cells array.

FIG. 4 shows a reference cells array 110 including reference flash cells Ri1–Ri7, wherein i=1–4.

The reference cells array 110 is electrically coupled to the primary cells array 100 for sharing the corresponding word lines. For example, the word line WL1' of the reference flash cells R11–R17 is electrically coupled to the word line WL1 of a primary cells array 100 for receiving a signal coming from the word line WL1. The bit lines BL1–BL7 of the reference cells array 110 are electrically coupled to a reference input circuit 130. A reference array control circuit 112 is electrically coupled to the reference cells array 110 thereby to control the reference cell array 110.

To set the threshold voltages of the reference flash cells R11–R17 in the reference cells array 110, a word-line decoder 102 electrically coupled to the primary cells array 100 first selects a word line, for example, a word line WL1. Next, a high voltage of 15V is applied to the word line WL1. At the same time, the reference data input circuit 130 receives a pre-selected reference signal and then transmits output signals with the potentials of 6.5V, 5.5V, 4.5V, 3.5V, 2.5V, 1.5V and 0.5V from output ends A, B, C, D, E, F and G, respectively. The output signals from the output ends A, B, C, D, E, F and G are transmitted to the bit lines B1–B7 of the selected cells R11–R17 thereby to set the threshold voltages of the cells R11–R17 at 0.5V, 1.5V, 2.5V, 3.5V, 4.5V, 5.5V and 6.5V, respectively, and to generate corresponding source-drain currents I1–I7. Similarly, the other word lines WL2–WL4 can be selected in order by the same method. Therefore, the threshold voltage of cells connected to the bit line BL1 is set at 6.5V, the threshold voltage of cells connected to the bit line BL2 is set at 5.5V.

Figure 5:
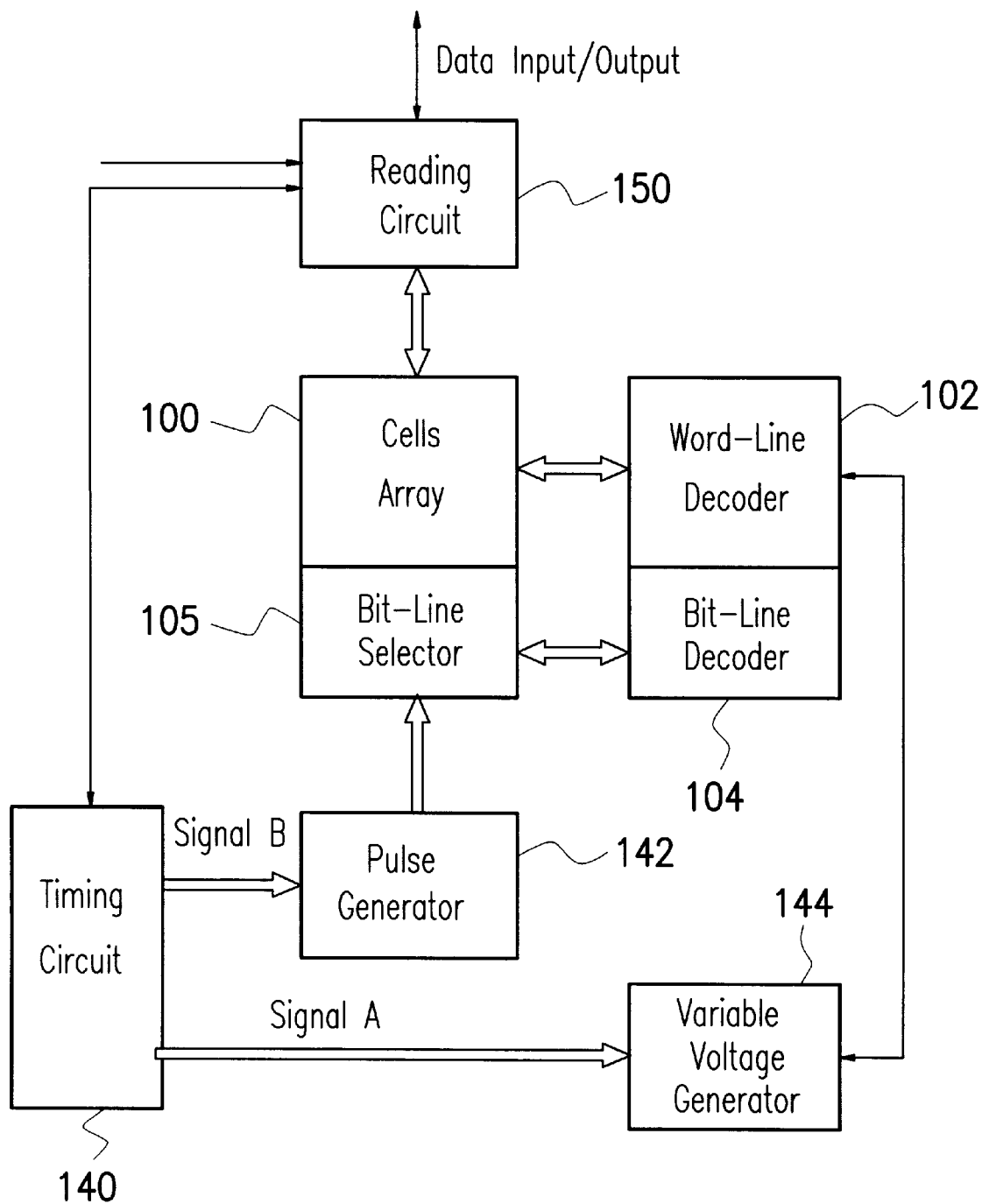
FIG. 5 is a detailed circuit diagram for data writing.
Figure 6A:
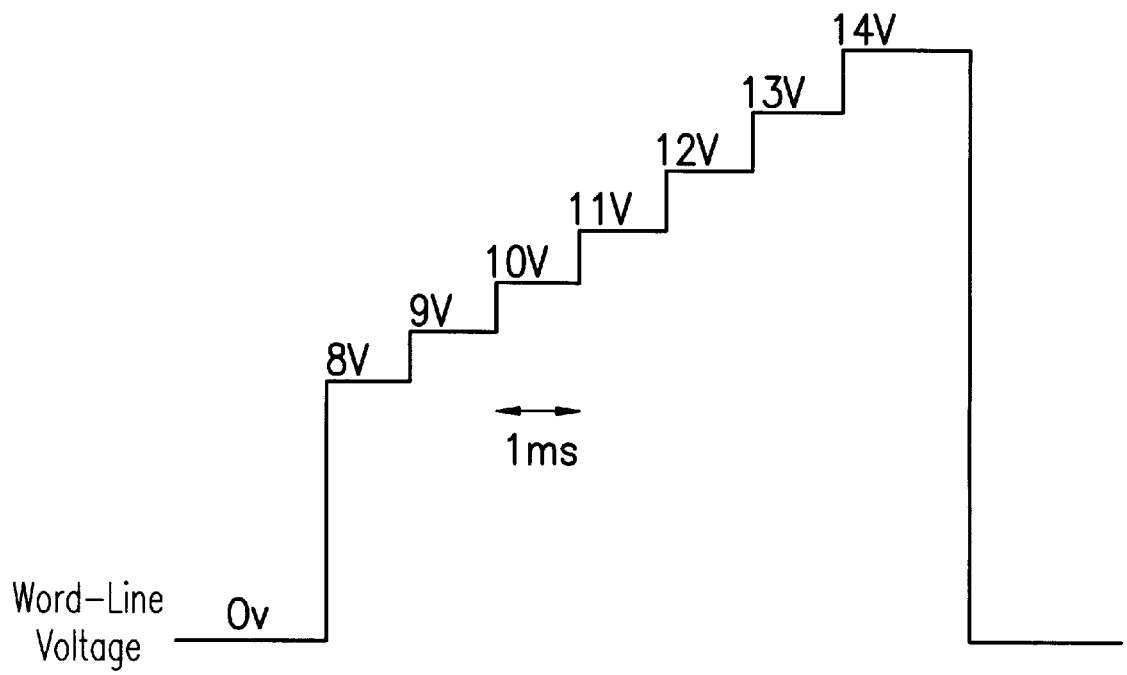
FIGS. 6A and 6B are schematic views showing wave forms of a step word-line voltage and a DC bit-line voltage, respectively, when writing data into a flash cell.
Figure 6B:
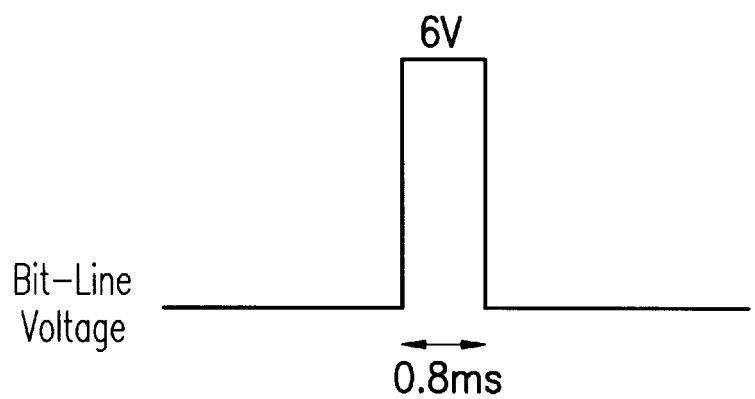

As to a writing operation as shown in FIG. 5, a variable voltage generator 144 receives a triggering signal A from a timing circuit 140 and then generates a step voltage of 0V, 8V, 9V, 10V, 11V, 12V, 13V and 14V in sequence with a time interval of 1 ms as shown in FIG. 5A. The 8 voltage values are corresponding to the 8 sets of digital signals "111", "110", ..., "000". On the other hand, a pulse generator 142 receives a triggering signal B from the timing circuit 140 and then generates a pulse signal $V_{BL}$ with a time width of less than 1 ms, such as a 6V pulse with a time width of 0.8 ms, as shown in FIG. 6B. Thereafter, the pulse signal $V_{BL}$ is input to a bit line which is selected from a bit-line selector 105 by the bit-line decoder 104.

Referring to FIG. 3, if digital data "010" needs to be written into the cell M5, the word line WL4 is first selected and the pulse signal of 6V with a time width of 0.8 ms is applied to the bit line BL1 when the step voltage reaches a level of 12V. As a result, the digital data "010" is written to the cell M5. Therefore, the 5V threshold voltage of the cell M5 indicates that the stored digital data are "010."

Figure 7A:
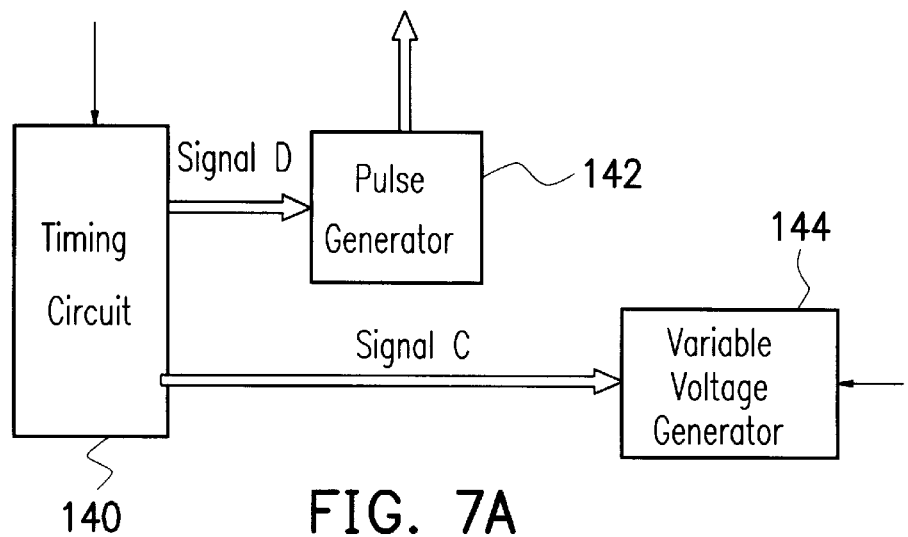
FIG. 7A is a circuit diagram for data reading.
Figure 7B:
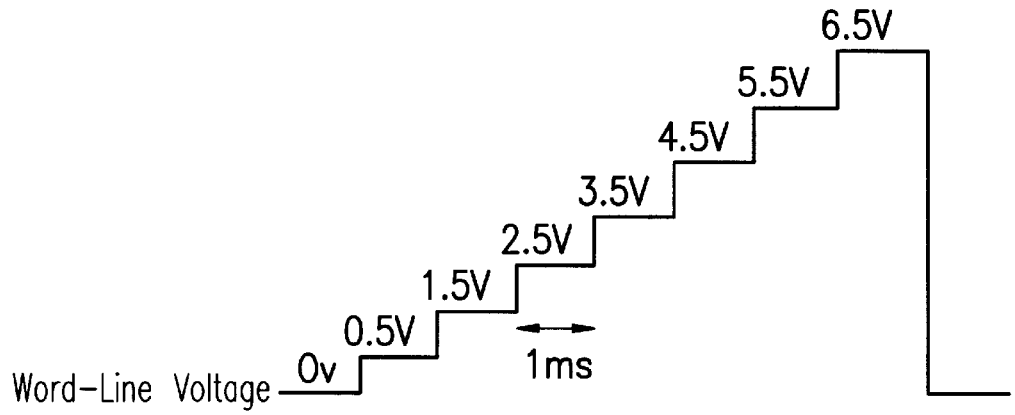
FIGS. 7B and 7C are schematic views showing a step word-line voltage and a DC bit-line voltage, respectively, when reading digital data stored in a flash cell.
Figure 7C:

Referring to FIGS. 7A and 7C, how to read out digital data stored in the flash cells of the primary cells array 100 is described hereafter. In FIG. 7A, the variable generator 144 receives a triggering signal C from the timing circuit 140 and then transmits a step voltage of 0.5V, 1.5V, 2.5v, 3.5V, 4.5V, 5.5V and 6.5V in sequence with a time interval of 1 ms as shown in FIG. 7B. On the other hand, the pulse generator 142 receives a triggering signal D from the timing circuit 140 and transmits a DC pulse signal of 1V with a time width of more than 8 ms.

A word line and a bit line of the primary cells array 100 are selected by the word-line decoder 102 and the bit-line decoder 104. The above-mentioned step voltage is input to the selected word line, and the DC pulse signal is input to the selected bit line, thereby reading out digital data stored in the flash cell. When one of the flash cells in the primary cells array 100 is read, a corresponding drain-source current I0 is generated and transmitted to the sense amplifier 120. Moreover, the reference cells array also transmits the currents I1–I7 to the sense amplifier 120. The sense amplifier 120 compares the current I0 with the reference currents I1–I7.

Figure 8:
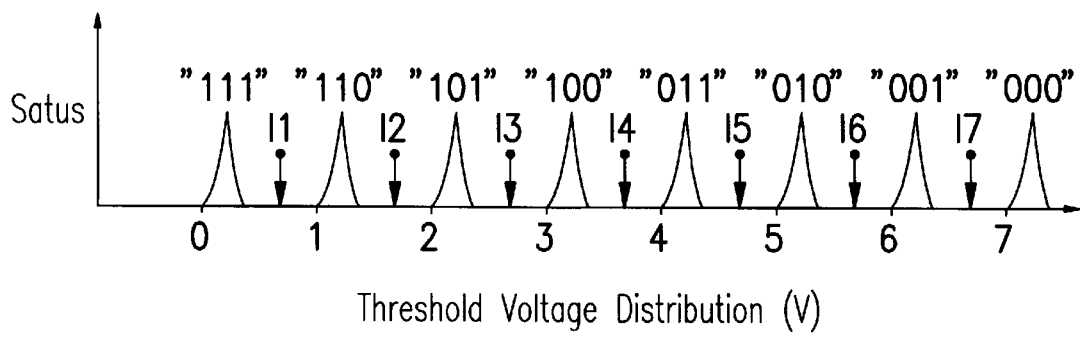
FIG. 8 is a distribution graph showing threshold voltages and corresponding digital data stored in flash cells.

FIG. 8 is a distribution graph showing threshold voltages and corresponding digital data stored in cells. In FIG. 8, the reference currents I1–I7 output from the reference cells array are used for comparison. For example, if a sense current I0 is less than I1, it shows that digital data stored in a selected cell is "111." If a sense current I0 is located between I4 and I5, it shows that digital data stored in a selected cell is "011", and the like.

As can be seen from the above, multilevel digital data stored in a selected cell can be precisely determined/fetched by only one comparison according to the invention. In the embodiment of the invention, 3-bit digital data are taken as an example. Therefore, it obviously shows that the time spent for reading digital data stored in a selected cell is greatly shorten. In particular, the invention displays a great efficiency in developing a great amount of memory capacity. Moreover, regardless of the number of bits that each set of digital data has, only the reference cells array is used for comparison, so the size of devices is significantly shrunk.

Figure 9:
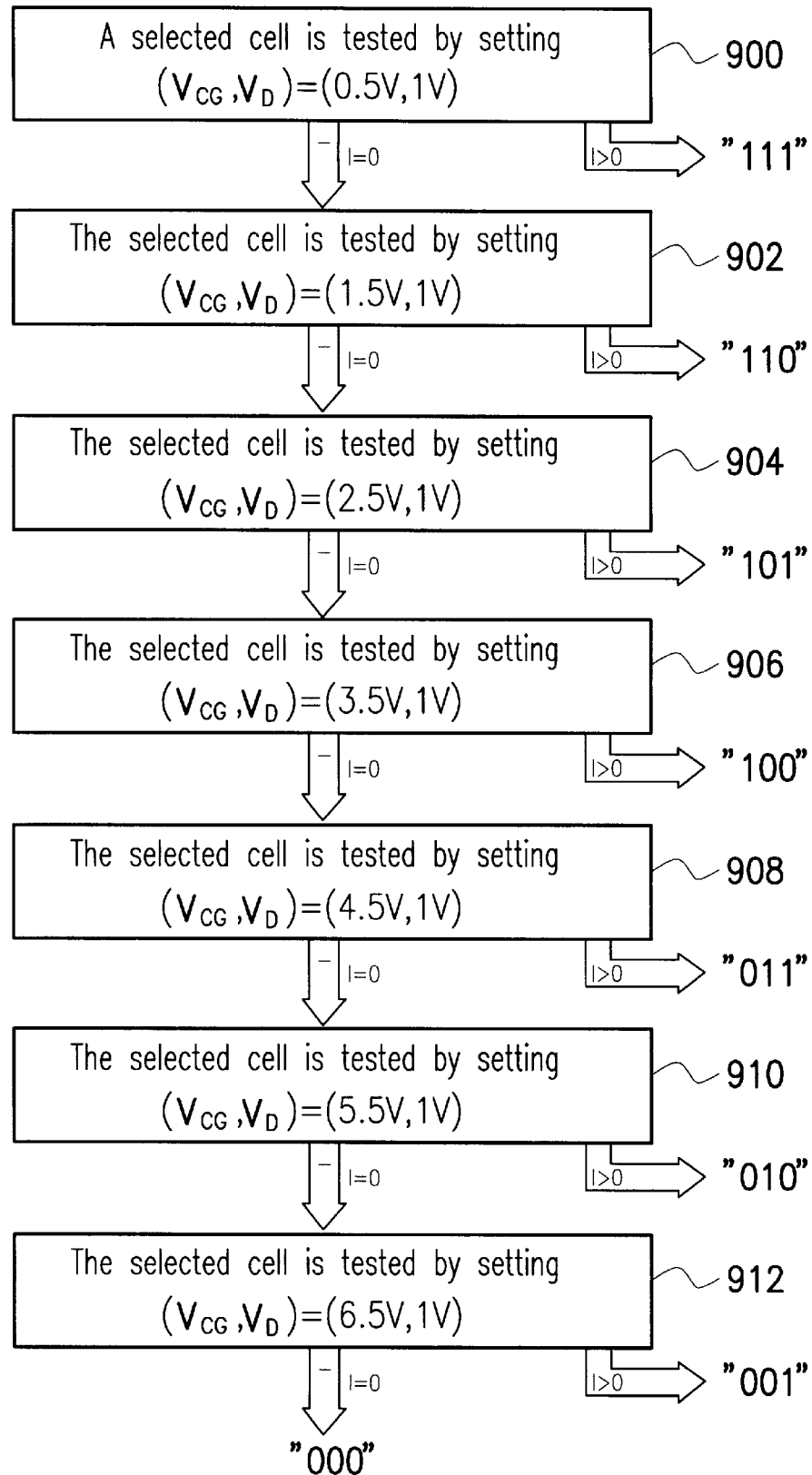
FIG. 9 is a flow chart showing a method of reading digital data stored in a flash cell.

Finally, referring to FIG. 9, a flow chart of reading a memory is shown.

First, in step 900, voltages applied on the word line and the bit line corresponding to a selected cell are set at 0.5V and 1V, respectively (that is, ($V_{CG}$, $V_D$)=(0.5,1V)). At this point, if the sense amplifier 120 senses a current, it shows that digital data stored in the selected cell are "111". Inversely, if no current is sensed, the voltage applied on the word line is added with one unity. As shown in step 902, the voltages of the word line and the bit line corresponding to the selected cell are set at 1.5V and 1V, respectively (that is, ($V_{CG}$, $V_D$)=(1.5V, 1V)). At this time, if the sense amplifier senses a current, it shows that digital data stored in the selected cell are "110." If no current is sensed, the voltage applied on the word line is further added with one unity.

Similarly, steps 904–912 are performed in order until digital data stored in the selected cell are correctly determined/fetched. As described above, for a selected cell used to store a set of n-bit digital data, $2^n-1$ times of comparisons are required at most thereby to determine/fetch the digital data.

Therefore, unlike the prior art where digital data stored in a selected cell are read bit by bit, a first feature of the invention is that digital data stored in a selected cell are completely read out in one time thereby to shorten the reading time.

A second feature of the invention is that only one reference cells array is used for comparisons thereby to determine/fetch multilevel digital data stored in a selected cell. Therefore, it is not only good for miniaturization of devices, but also simplifies the complexity of circuit designs.

Furthermore, a third feature of the invention is that each flash cell can store multibit digital data thereby to increase memory capacity.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A multilevel sense device for a flash memory which comprises a primary cells array having a plurality of word lines and bit lines, a word-line decoder coupled to the word lines of the primary cells array and a bit-line decoder coupled to the bit lines of the primary cells array, the multilevel sense device comprising:

a reference cells array coupled to the primary cells array for sharing the word lines of the primary cells array and outputting a plurality of permanent reference currents thereby to create a plurality of current comparison intervals;

a sense amplifier coupled to the primary cells array for receiving the permanent reference currents and a sense current output from a selected flash cell of the primary cells array and then comparing the sense current with the current comparison intervals thereby to determine/fetch digital data which are stored in the selected flash cell and corresponding to the sense current.

2. The multilevel sense device as claimed in claim 1, further comprising a reference data input circuit coupled to the reference cells array for setting the reference value of the reference cells array.

3. The multilevel sense device as claimed in claim 1, further comprising a data input circuit coupled to the bit lines of the primary cells.

4. The multilevel sense device as claimed in claim 3, wherein the data input circuit further comprises a timing circuit, a pulse generator and a variable voltage generator, wherein the timing circuit is used to control the pulse generator to output a pulse signal to one of the bit lines and to control the variable voltage generator to output a step voltage to one of the word lines.

5. The multilevel sense device as claimed in claim 2, further comprising a data input circuit coupled to the bit lines of the primary cells.

6. The multilevel sense device as claimed in claim 5, wherein the data input circuit further comprises a timing circuit, a pulse generator and a variable voltage generator, wherein the timing circuit is used to control the pulse generator to output a pulse signal to one of the bit lines and to control the variable voltage generator to one of the word lines.

7. A multilevel sense device for flash memory, comprising:

a primary cells array having a plurality of flash cells, a plurality of word lines and a plurality of bit lines, wherein each flash cell stores multilevel digital data and one of the flash cells creates a sense current when read;

a reference cells array coupled to the primary cells array for sharing the word lines of the primary cells array and outputting a plurality of permanent reference currents to create a plurality of current comparison intervals;

a sense amplifier coupled to the primary cells array for receiving the permanent reference currents and a sense current output from the read primary cells array and then comparing the sense current with the current comparison intervals thereby to determine/fetch digital data which are stored in the selected cell and corresponding to the sense current.

8. The multilevel sense device as claimed in claim 7, further comprising a word line decoder coupled to the word lines of the primary cells array for selecting one of the word lines.

9. The multilevel sense device as claimed in claim 7, further comprising a bit line decoder coupled to the bit lines of the primary cells array for selecting one of the bit lines.

10. The multilevel sense device as claimed in claim 7, further comprising a data input circuit coupled to the bit lines of the primary cells.

11. The multilevel sense device as claimed in claim 10, wherein the data input circuit further comprises a timing circuit, a pulse generator and a variable voltage generator, wherein the timing circuit is used to control the pulse generator to output a pulse signal to one of the bit lines and to control the variable voltage generator to output a step voltage to one of the word lines.

12. A multilevel sense method for a flash memory, wherein a selected flash cell has a word line and a bit line, the method comprising:

applying a DC pule voltage on the bit line;

applying a word line voltage on the word line;

ending the sense operation when the selected flash cell creates a sense current thereby to fetch multilevel digital data which are stored in the selected flash memory while the word line voltage is added with one unity for further sensing when no sense current is created by the selected flash memory.

* * * * *